United States Patent [19]

Gabric et al.

[11] Patent Number: 5,281,302

[45] Date of Patent: Jan. 25, 1994

[54] METHOD FOR CLEANING REACTION CHAMBERS BY PLASMA ETCHING

[75] Inventors: Zvonimir Gabric, Zorneding; Alexander Gschwandtner, Munich; Oswald Spindler, Vaterstetten, all of Fed. Rep. of Germany

[73] Assignee: Siemens Aktiengesellschaft, Munich, Fed. Rep. of Germany

[21] Appl. No.: 4,528

[22] Filed: Jan. 14, 1993

[30] Foreign Application Priority Data

Jan. 27, 1992 [DE] Fed. Rep. of Germany ....... 4202158

[51] Int. Cl.⁵ .................... B44C 1/22; B29C 37/00; C03C 15/00; C03C 25/06
[52] U.S. Cl. ..................................... 156/643; 134/1; 156/657; 156/668
[58] Field of Search ............. 156/643, 646, 657, 668, 156/345; 204/192.37, 298.31; 134/1, 31, 102

[56] References Cited

U.S. PATENT DOCUMENTS

| | | | |
|---|---|---|---|
| 4,529,474 | 7/1985 | Fujiyama et al. | 156/643 |
| 4,885,047 | 12/1989 | Ury et al. | 156/345 |
| 5,158,644 | 10/1992 | Cheug et al. | 156/643 |

*Primary Examiner*—William Powell
*Attorney, Agent, or Firm*—Hill, Steadman & Simpson

[57] ABSTRACT

For cleaning parasitic layers of silicon oxides or nitrides in a reaction chamber, an etching gas mixture is employed in which at least one fluoridated carbon, particularly $CF_4$ and/or $C_2F_6$, is the main constituent. Then, an ozone/oxygen mixture ($O_3/O_2$) having optimally high ozone concentration is added to the reaction chamber. The etching gas mixture is excited in the reaction chamber by triggering the etching gas mixture to form a plasma, having extremely low power with an excitation frequency in the RF range. The etching gas mixture etches all surfaces in the reaction chambers free of residues with a high etching rate.

7 Claims, No Drawings

METHOD FOR CLEANING REACTION CHAMBERS BY PLASMA ETCHING

BACKGROUND OF THE INVENTION

The present invention relates to a method of cleaning by plasma etching. In particular, the present invention provides a method for cleaning reaction chambers employed in the deposition and etching of layers on silicon substrates utilizing plasma etching.

The cleaning of reaction chambers, given deposition and etching in the field of material coating, is acquiring increasing significance. For instance, the cleaning of reaction chambers is vital within the process sequence for manufacturing integrated circuits from silicon substrates. An increased need for highly efficient and production-compatible cleaning steps arises in conjunction with the increase of the chip integration density.

In addition to the wafer cleaning, the cleaning of the reaction chambers has proven especially critical. Every manufacturing cycle for producing layers or, respectively, for etching layers repeatedly utilize reaction chambers. With respect to silicon wafers, the cleaning of the reaction chambers is necessary no layer than following a specific throughput.

During the processes, the inner surfaces of these reaction chambers can become coated or contaminated at unwanted locations. In time, these parasitic layers lead to disturbances in the process management or to contamination of the workpiece to be coated or etched. In the present case, these layers are composed of organic polymers and/or oxides and nitrides of silicon. D. Widmann et al., "Technologie Hochintegrierter Schaltungen", Springer-Verlag 1988, illustrates the current state of deposition or etching technology, particularly sections 3.1.1, 5.2.3 and 5.3.5.

The disturbance of the processes or the contamination of the workpieces compels frequent chamber cleaning. This in turn leads to increased wear of parts, further including costs associated with replacement parts and preparation. In addition, increased frequency of chamber cleaning leads to high maintenance outlay in view of personnel and work time and, last but not least, to manufacture outages due to the low throughput and high down time. These disadvantages reach an especially great degree when the reaction chambers are opened and the layers and coats are conventionally cleaned by mechanical removal.

The known introduction of hydrogen fluoride vapor into the reaction chambers proves similarly disadvantageous in view of a great outlay in the work, operating and waste disposal reliability. Oxidic and nitridic layers are thereby converted into the vapor phase. However, the aggressivity of hydrogen fluoride jeopardizes the long-term stability of the partially surface-finished system parts.

Since reaction chambers are generally already designed for plasma-enhanced deposition of etching, current chamber cleaning ensues on the basis of in situ dry etching with etching gases activated in the plasma. Under current processes, layer-dissolving gases are introduced into the reaction chamber. A plasma generated with the existing electrodes then activates these gases. Then, the various fractions of the introduced gases react with the residues deposited in different thicknesses at the inner surfaces of the reaction chamber to form gaseous products that are conveyed out with vacuum pumps.

Fluoridated carbons, such as $CF_4$ and $C_2F_6$, or similar fluorine-containing gases, such as $SF_6$ and $NF_3$, are currently utilized in situ cleaning. The latter, however, again cause a deterioration of the surface quality of the inside chamber parts and therefore involve the disadvantages already cited above. On the other hand, a simultaneous polymer deposition accompanies etching with $CF_4$ and $C_2F_6$. This undesired polymer formation occurring during the course of cleaning is also indirectly negatively felt in that, among other things, the layers deposited in the next process step adhere poorly to the polymer layer. As a result, the easily detachable particles can often cause damage to the wafer.

Adding oxygen ($O_2$) to the etching gas can in fact reduce the polymer formation. However, without opening the chamber and using mechanical cleaning, the cleaning effect usually remains unsatisfactory. Moreover, $O_2$ plasma etching of organic residues is a relatively slow process that takes many times the actual coating or etching time to carry out and thus leads to disproportionately long cleaning times.

SUMMARY OF THE INVENTION

The present invention provides a method for cleaning parasitic layers in a reaction chamber comprising the following steps. First, an etching gas mixture is employed for cleaning silicon oxides or nitride parasitically deposited on the surfaces of the reaction chamber, wherein at least one fluoridated carbon is the main constituent of the etching mixture. Next, an ozone/oxygen mixture ($O_3/O_2$) having optimally high ozone concentration is added to the reaction mixture. Then, the etching gas mixture in the reaction chamber is excited by triggering the etching gas mixture to form a plasma, having extremely low power with an excitation frequency in the RF range. The etching gas mixture etches all surfaces in the reaction chamber free of residue with a high etching rate.

In one embodiment, the fluoridated carbon is $CF_4$. In another, the fluoridated carbon is $C_2F_6$.

When no silicon oxides or nitrides are to be eliminated, the present invention may also be used to clean organic residues from the inside surfaces of a reaction chamber. To this end, an ozone/oxygen mixture ($O_3/O_2$) having optimally high ozone concentration is employed as an etching gas mixture for cleaning the organic residues parasitically deposited on the inside surfaces of the reaction chamber. Then, the etching gas mixture is excited in the reaction chamber by triggering the ozone/oxygen mixture to form a plasma, having extremely low power with an excitation frequency in the RF range. The ozone/oxygen mixture etches all surfaces in the reaction chamber free of residue with a high etching rate.

In one embodiment, the present invention may be used to clean a polymer from the inside surfaces of a reaction chamber.

In one embodiment, the ozone/oxygen mixture has an ozone concentration of 5 to 20% by volume.

Additional feature and advantages of the present invention are described in, and will be apparent from, the detailed description of the presenting preferred embodiments.

DETAILED DESCRIPTION OF THE PREFERRED EMBODIMENTS

The present invention provides a method for cleaning parasitic layers in a reaction chamber employed in the deposition and etching of layers on silicon substrates. To this end, the present invention utilizes a etching mixture and an ozone/oxygen mixture. The etching mixture consists of primarily of at least one fluoridated carbon. Triggering the etching gas mixture to form a plasma, having extremely low power with an excitation frequency in the RF range, excites the etching gas mixture within the reaction chamber.

As a result of the spontaneous reaction of the ozone with the fluoridated carbons, an extremely great amount of reactive fluorine becomes locally free, resulting in a great rise in the etching rate of the silicon oxides or nitrides. Simultaneously, the ozone in a highly surface-controlled reaction directly attack the polymers at the surface. As a result, the polymers are rapidly converted into gaseous products. Thus, the formation of new polymers is entirely avoided.

The cleaning of the invention simultaneously ensues residue-free and with high etching rate, i.e. the cleaning times are short while also being gentle on the materials. Since ozone increases the etching activity both in view of the oxygen as well as the fluoridated carbons, the plasma power necessary in the cleaning process can be reduced. The acceleration voltage or, respectively, the excitation frequency can be kept relatively low, for instance in the region of a few kHz to approximately 100 MHz. A lower kinetic energy of the etching etchant gas particles accompanies the low acceleration voltage or, respectively, the excitation frequency. As a result, the chamber surfaces, particularly the electrodes as well, are damaged less due to sputter-off or ion bombardment.

A further advantage derives therefrom on that the reaction of the ozone with the metallic inside surfaces of the reaction chamber, preferably composed of aluminum, passivates the chamber surfaces. The surfaces can therefore better resist further attack of etching gases.

Pursuant to the present invention, the cleaning of organic residues can, for example, ensue at a pressure of 100 to 5000 Pa according to the reaction equation:

$$C_xH_yF_z + O_3/O_2 \rightarrow CO_2 + H_2O + H_yC_rF_z$$

Preferably, the ozone/oxygen mixture has a ozone concentration of 5 to 20% by volume. However, this range is selected primarily for safety reasons. In general, the ozone concentration as regards advantageous etching results could also lie above the limitation of 20% by volume in $O_2$.

The etching of $Si_3N_4$ in, for example, a CVD coating chamber can ensue according to the following reaction equation:

$$Si_3N_4 + 3CF_4 \xrightarrow{O_3} 3SiF_4 + 2N_2 + 3CO_2$$

The etching of a parasitic oxide layer can, for example, ensue according to the reaction equation:

$$SiO_2 + CF_4 \xrightarrow{O_3} SiF_4 + CO_2$$

In both instances, work is again carried out given a pressure of 100 to 5000 Pa and at a temperature from 300° to 400° C. The employment of ozone enables the use of relatively high pressures. The result is that a highly localized plasma is ignited, further reducing the risk of damage to sensitive parts in the inside of the reaction chamber.

Although modifications and changes may be suggested by those skilled in the art, it is the intention of the inventors to embody within the patent warranted hereon all such changes are reasonably and properly come within the scope of their contribution to the art.

We claim:

1. A method for cleaning parasitic layers in a reaction chamber comprising the steps of:
    introducing an etching mixture into a selected reaction chamber, said etching mixture for cleaning layers of silicon oxides or nitrides parasitically deposited on inside surfaces of the reaction chamber and said etching mixture having a main constituent of at least one fluoridated carbon;
    adding an ozone/oxygen mixture ($O_3/O_2$) having optimally high ozone concentration to the etching mixture in said reaction chamber; and
    exciting the etching gas mixture in the reaction chamber by triggering said etching gas mixture to form a plasma, having extremely low power with an excitation frequency in the RF range.

2. The method of claim 1 wherein the fluoridated carbon is $CF_4$.

3. The method of claim 1 wherein the fluoridated carbon is $C_2F_6$.

4. The method of claim 1 wherein the ozone/oxygen mixture has an ozone concentration of 5 to 20 percent by volume.

5. A method for cleaning parasitic layers in a reaction chamber comprising:
    introducing an ozone/oxygen mixture ($O_3/O_2$) having optimally high ozone concentration into a reaction chamber as an etching gas mixture for cleaning layers of organic residues parasitically deposited on inside surfaces of the reaction chamber; and
    exciting the ozone/oxygen mixture in the reaction chamber by triggering said ozone/oxygen mixture to form a plasma, having extremely low power with an excitation frequency in the RF range.

6. The method of claim 5 wherein the organic residue is a polymer.

7. The method of claim 5 wherein the ozone/oxygen mixture has an ozone concentration of 5 to 20% by volume.

* * * * *